United States Patent
Fujisawa et al.

(10) Patent No.: US 6,919,153 B2
(45) Date of Patent: Jul. 19, 2005

(54) DOSE MONITORING METHOD AND MANUFACTURING METHOD OF SEMICONDUCTOR DEVICE

(75) Inventors: Tadahito Fujisawa, Tokyo (JP); Soichi Inoue, Yokohama (JP); Takashi Sato, Fujisawa (JP); Masafumi Asano, Yokohama (JP)

(73) Assignee: Kabushiki Kaisaha Toshiba, Tokyo (JP)

( * ) Notice: Subject to any disclaimer, the term of this patent is extended or adjusted under 35 U.S.C. 154(b) by 193 days.

(21) Appl. No.: 10/611,247

(22) Filed: Jul. 2, 2003

(65) Prior Publication Data

US 2004/0058256 A1 Mar. 25, 2004

(30) Foreign Application Priority Data

Jul. 3, 2002 (JP) .................................... 2002-194927

(51) Int. Cl.⁷ .............................. G03C 5/00; G03F 9/00
(52) U.S. Cl. ......................................... 430/30; 430/311
(58) Field of Search .................................. 430/30, 311

(56) References Cited

U.S. PATENT DOCUMENTS

| 6,226,074 | B1 | 5/2001 | Fujisawa et al. | |
| 6,251,544 | B1 | 6/2001 | Inoue et al. | |
| 6,376,139 | B1 | 4/2002 | Fujisawa et al. | |
| 6,416,913 | B1 * | 7/2002 | Suzuki | 430/30 |
| 2003/0219655 | A1 * | 11/2003 | Sutani et al. | 430/5 |
| 2004/0265713 | A1 * | 12/2004 | Shiobara et al. | 430/30 |

OTHER PUBLICATIONS

Starikov; "Exposure Monitor Structure", SPIE vol. 1261, Integrated Circuit Metrology, Inspection, and Process Comtrol IV, pp. 315–324, (1990).

Fujisawa et al.; "Method of Manufacturing Semiconductor Device", U.S. Appl. No. 10/107,246, filed Mar. 28, 2002.

Sutani et al.; "Focus Monitoring Method, Exposure Apparatus, and Exposure Mask"; U.S. Appl. No. 10/052,527, filed Jan. 23, 2002.

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

There is disclosed a dose monitor method comprising illuminating a mask with illumination light, which is disposed in a projection exposure apparatus and in which a dose monitor pattern is formed, passing only a 0th-order diffracted light through a pupil surface of the projection exposure apparatus in diffracted lights of the dose monitor pattern, and transferring a 0th-order diffracted light image of the dose monitor pattern onto a substrate to measure dose, wherein during the illuminating, a center of gravity of the 0th-order diffracted light image passed through the dose monitor pattern on the pupil surface of the projection exposure apparatus is shifted from an optical axis of the projection exposure apparatus.

18 Claims, 11 Drawing Sheets

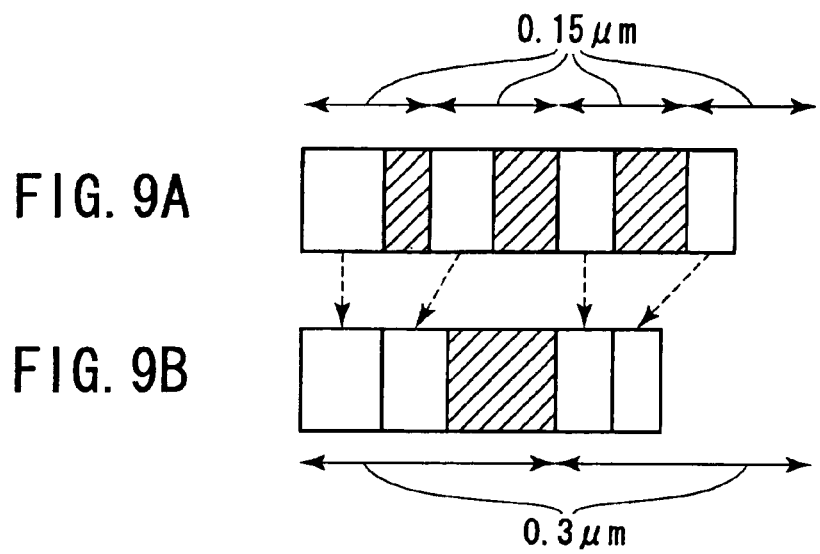
FIG. 9A
FIG. 9B
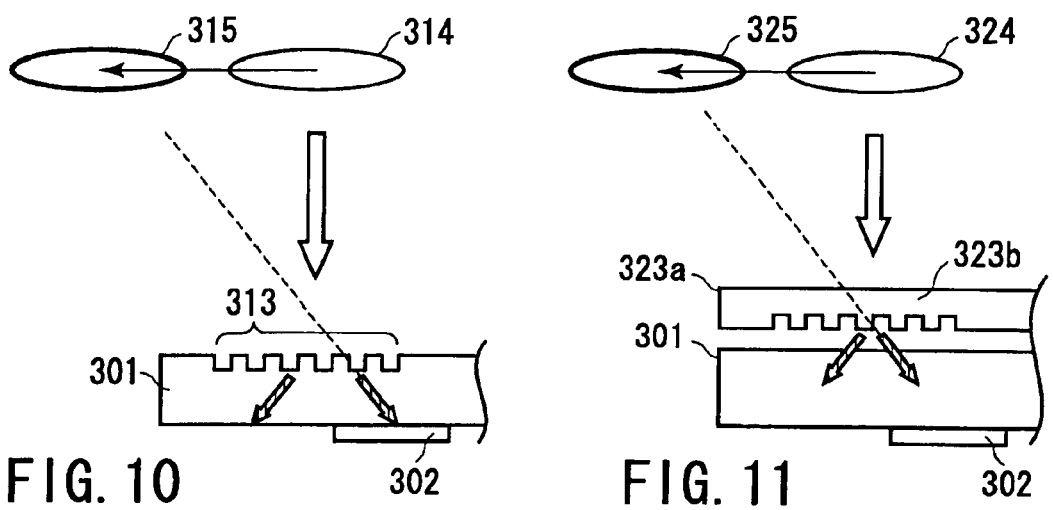
FIG. 10
FIG. 11
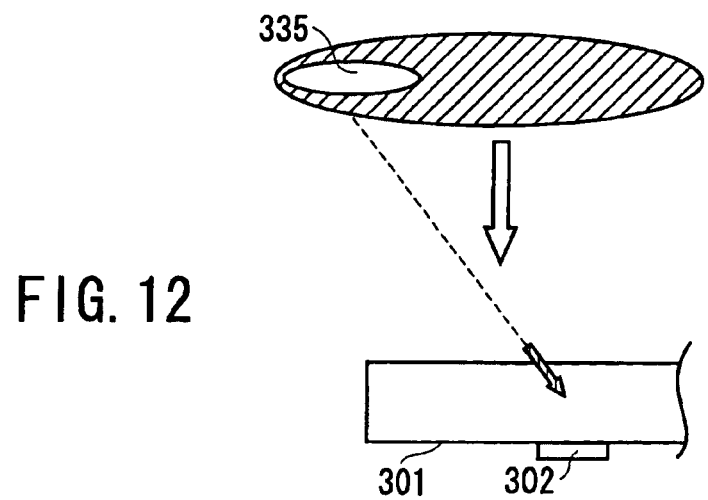
FIG. 12

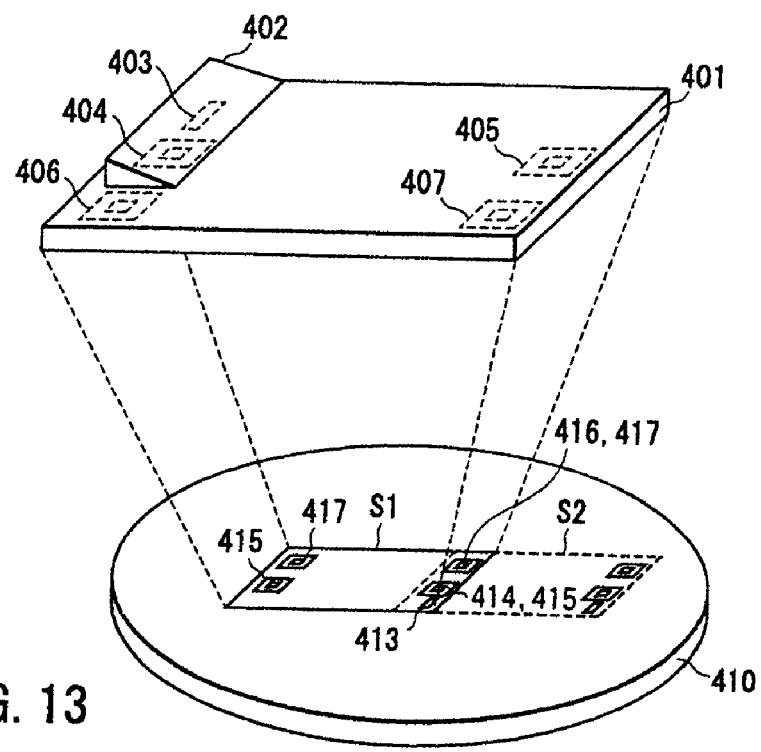
FIG. 13
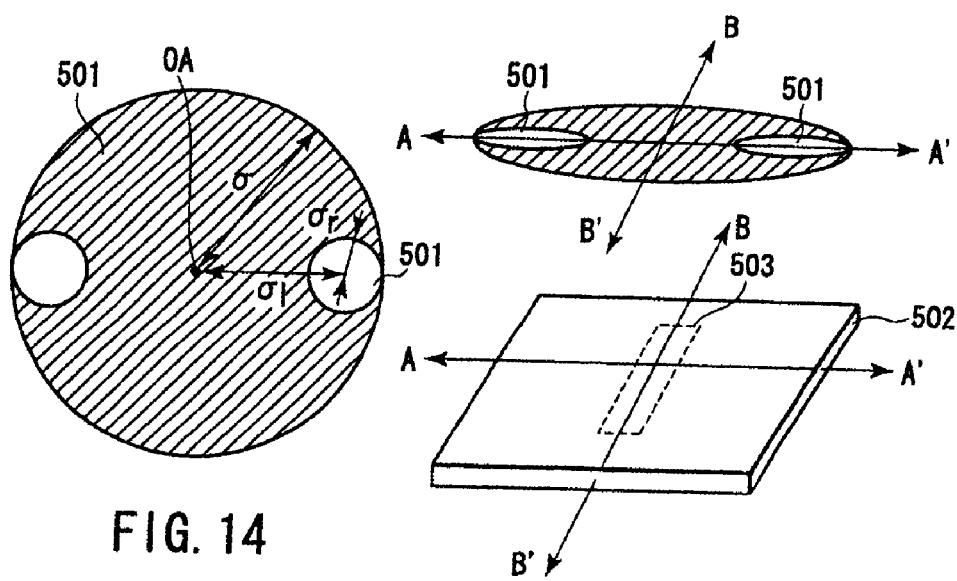
FIG. 14
FIG. 15

$$NA(\sqrt{(1+\sigma_r)^2-(\sigma_l\sin\theta)^2}+\sigma_l\cos\theta)$$

DOSE MONITORING METHOD AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2002-194927, filed Jul. 3, 2002, the entire contents of which are incorporated herein by reference.

BACKGROUND OF THE INVENTION

1. Field of the Invention

The present invention relates to a dose monitoring method for monitoring dose in a lithography process with improved accuracy, and a manufacturing method of a semiconductor device.

2. Description of the Related Art

Due to the demands for miniaturization of a device pattern of a semiconductor device, an exposure wavelength has been reduced, the NA of a projection lens has been raised, and processing techniques have improved. However, in recent years, demands for miniaturization of the device pattern have become stricter. As a result, it is difficult to obtain a sufficient dose tolerance and an exposure margin of a focal depth, and this has caused a drop in yield. Therefore, higher accuracy dose and focus control are needed in order to deal with the limited dose tolerance, to prevent a drop in yield.

The dose was previously judged by measurement of a line width of the pattern. However, the line width of the pattern changes not only with the dose but also with focus. If the pattern is made finer, the influence of a focus error on the line width of the pattern cannot be ignored. Therefore, it is difficult to judge whether the influence is caused by fluctuation of an adequate dose or by fluctuation of a focus position. Therefore, to realize exposure of the pattern of a minimum design rule with high accuracy, both the dose and the focus have been requested to be separately monitored with high accuracy, and to be individually managed.

As a method of measuring effective dose which is not influenced due to focus fluctuation, in SPIE Vol. 1261 Integrated Circuit Metrology, Inspection, and Process Control IV (1990) p. 315, a method has been proposed with respect to a dose monitor pattern which is not influenced by the line width by focus error. This dose monitor pattern is characterized in that a transmission portion and shield portion are arranged in one direction in a block having a width not resolved in a projection exposure apparatus for use. A plurality of blocks different in dimension ratio of the transmission portion to the shield portion are arranged in the direction while the dimension ratio is monotonously changed.

Upon illumination of the dose monitor pattern with illumination light, a latent image having an inclination distribution of an irradiation amount which does not depend on a state of focus is formed in a resist film on a substrate. When the length of one direction of the latent image formed in the resist film or the pattern obtained by developing the resist film is measured, the dose is measured.

Sensitivity of the dose monitor pattern is determined of fineness of setting of a duty ratio. When a width p of a block is large, and the duty ratio is fine, the dose monitor pattern can be formed with a higher sensitivity.

With refinement of the design rule, the exposure apparatus tends to be high in NA, short in wavelength, and high in σ. Therefore, the required width p of the block in the dose monitor pattern has tended to be finer. Furthermore, also for the duty ratio, in manufacturing a mask, it is difficult to set a pattern increment in design to be extremely fine. Due to the above-described reason, it has been difficult to obtain the sensitivity of the effective dose, required for the dose monitor pattern.

For example, it is assumed that a mask to be monitored in the effective dose is set in the exposure apparatus having exposure conditions including a numerical aperture NA of 0.68, a coherent factor σ of 0.85, and a wavelength λ of 0.193 μm. The condition of the width p (dimension on a wafer) of the block which is not resolved in this apparatus is as follows according to diffraction theory:

$$\frac{1}{p} \geq (1+\sigma)\frac{NA}{\lambda} \quad (1)$$

$$P \leq \frac{\lambda}{NA(1+\sigma)}$$

From the equation (1), it is necessary to set the width p to 0.15 μm or less. It is a difficult situation to prepare a block having a width of 0.15 μm or less with high accuracy. Moreover, to raise detection sensitivity of the dose monitor pattern, the duty ratio has been requested to be set to be as fine as possible, and this is further difficult in manufacturing the pattern.

As described above, it is difficult to manufacture the dose monitor pattern with high a accuracy. As a result, there is a problem that it is difficult to obtain the sensitivity of the effective dose which has been required for the dose monitor pattern.

BRIEF SUMMARY OF THE INVENTION (1) According to one aspect of the present invention, there is provided a dose monitor method comprising:

illuminating a mask with illumination light, which is disposed in a projection exposure apparatus and in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;

passing only a 0th-order diffracted light through a pupil surface of the projection exposure apparatus in diffracted lights of the dose monitor pattern; and transferring a 0th-order light diffracted image of the dose monitor pattern onto a substrate to measure dose, wherein during the illuminating, a center of gravity of the 0th-order diffracted light image passed through the dose monitor pattern in the pupil surface of the projection exposure apparatus is shifted from an optical axis of the projection exposure apparatus.

(2) According to one aspect of the present invention, there is provided a dose monitor method comprising:

disposing a mask in which a dose monitor pattern is formed including a plurality of blocks intermittently or continuously arranged in one direction each including a shield portion and transmission portion arranged in a constant width p incapable of being resolved in a projection exposure apparatus in the direction and having a monotonously changing dimension ratio of the shield portion to the transmission portion of the block in the direction in the projection exposure apparatus comprising double pole illumination in which two eccentric light sources are disposed symmetrically about a point with respect to an optical axis;

illuminating the mask with illumination light;

passing only a 0th-order diffracted light through a pupil surface of the projection exposure apparatus in diffracted lights of the dose monitor pattern; and transferring a 0th-order diffracted light image of the dose monitor pattern onto a substrate to measure dose, wherein the direction substantially crosses at right angles to an arrangement direction of the two eccentric light sources.

(3) According to one aspect of the present invention, there is provided a dose monitor method comprising:

preparing a projection exposure apparatus comprising fourfold pole illumination in which four eccentric light sources are disposed symmetrically four times with respect to an optical axis;

preparing a mask in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;

disposing the mask in the projection exposure apparatus;

illuminating the mask with illumination light;

passing only a 0th-order diffracted light through a pupil surface of the projection exposure apparatus in diffracted lights of the dose monitor pattern; and transferring a 0th-order diffracted light image of the dose monitor pattern onto a substrate to measure dose, wherein the direction passes through the optical axis and extends substantially in parallel with one of two symmetry axes which do not pass through a center of the eccentric light source.

(4) According to one aspect of the present invention, there is provided a dose monitor method comprising:

preparing a projection exposure apparatus comprising fourfold pole illumination in which four eccentric light sources are disposed symmetrically twice with respect to an optical axis;

preparing a mask in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;

disposing the mask in the projection exposure apparatus;

illuminating the mask with illumination light;

passing only a 0th-order diffracted light through a pupil surface of the projection exposure apparatus in diffracted lights of the dose monitor pattern; and transferring the dose monitor pattern onto a substrate to measure dose, wherein the direction extends substantially in parallel with a symmetry axis distant from an eccentric light source center in two symmetry axes.

BRIEF DESCRIPTION OF THE SEVERAL VIEWS OF THE DRAWING

FIG. 9A is a diagram showing a schematic constitution of a related-art dose monitor pattern;

FIG. 9B is a diagram showing a schematic constitution of the dose monitor pattern according to the present embodiment;

FIG. 10 is a diagram showing a dose monitor method according to the first embodiment;

FIG. 11 is a diagram showing the dose monitor method according to the first embodiment;

FIG. 12 is a diagram showing the dose monitor method according to the first embodiment;

FIG. 13 is a diagram showing a dose and focus monitor method according to a second embodiment;

FIG. 14 is a plan view showing the schematic constitution of double pole illumination according to a third embodiment;

FIG. 15 is a diagram showing an arrangement relation between the double pole illumination and dose monitor pattern according to the third embodiment;

DETAILED DESCRIPTION OF THE INVENTION

Embodiments of the present invention will be described hereinafter with reference to the drawings.
(First Embodiment)

Figure 1:
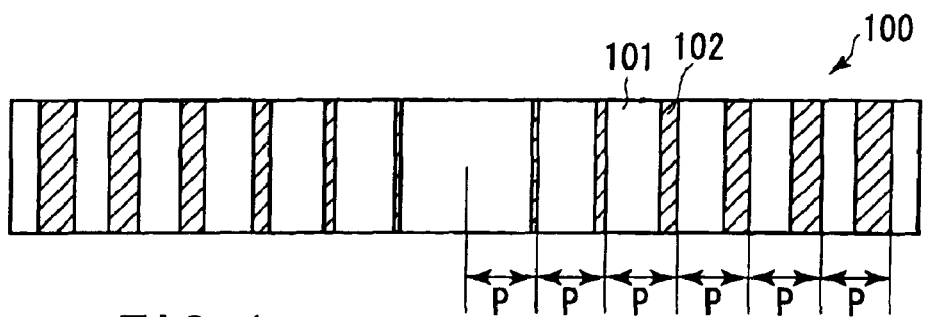
FIG. 1 is a plan view showing a constitution of a dose monitor pattern according to a first embodiment.

FIG. 1 is a plan view showing a constitution of a dose monitor pattern according to a first embodiment of the present invention.

As shown in FIG. 1, in a dose monitor pattern 100, a transmission portion 101 and shield portion 102 are arranged in a block having a width p which is not resolved in an exposure apparatus. A plurality of blocks are continuously arranged in an arrangement direction of the transmission portion 101 and shield portion 102 in the block. Moreover, in the arrangement direction, a duty ratio of the transmission portion 101 to the shield portion 102 in the block monotonously changes. Note that the plurality of blocks may also be intermittently arranged.

When the dose monitor pattern is irradiated with illumination light, a light intensity distribution of a diffracted light of the dose monitor pattern on a substrate surface monotonously decreases or increases independent of a focal position.

When a resist film is formed on a substrate, a latent image corresponding to an inclination distribution of an irradiation amount not depending on a state of focus is formed in the resist film. When a length of one direction of the latent image formed in the resist film or a pattern obtained by developing the resist film is measured, dose is measured.

After calibrating a dose set value of the exposure apparatus from the measured dose, a semiconductor device pattern is transferred onto the resist film formed on the semiconductor substrate. When the dose is controlled by the dose monitor pattern, and even when there is little dose tolerance, the pattern can preferably be transferred.

Figure 2:
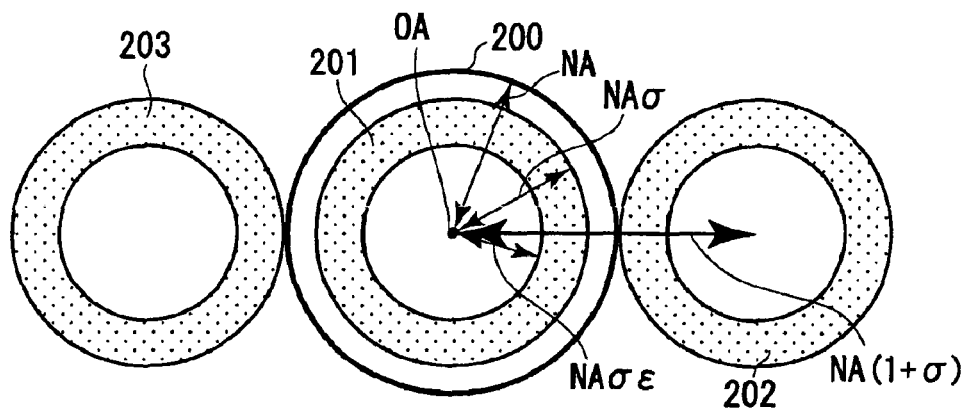
FIG. 2 is a plan view showing a diffracted image distribution on a pupil surface of a projection exposure apparatus, obtained in projecting/exposing the dose monitor pattern shown in FIG. 1.

A sensitivity of the dose monitor pattern is determined by fineness of an increment inc. which changes the duty ratio. FIG. 2 shows a diffracted image distribution on a pupil surface of a projection exposure apparatus, obtained in projecting/exposing the dose monitor pattern 100 shown in FIG. 1. For the diffracted images in the dose monitor pattern, only a 0th-order diffracted light image 201 is allowed to enter a pupil surface 200 having a numerical aperture NA. Accordingly, without being influenced by focus, effective dose can be monitored. In FIG. 2, reference numeral 202 denotes a +primary diffracted light image, 203 denotes a −primary diffracted light image, and OA denotes an optical axis.

The exposure apparatus, which is an object, is an ArF excimer laser exposure apparatus (wavelength λ=0.193 μm) in which a substrate-side numerical aperture NA=0.68, coherent factor σ=0.85, and orbicular zone screen factor ε=0.5.

However, from the above equation (1), according to the above-described exposure condition, the block width p needs to be 0.15 μm. This is stricter than a rule of a critical device pattern of the same generation. Therefore, it is remarkably difficult to form the dose monitor pattern with good precision.

To solve the problem, the present inventors have noticed that a position of a 0th-order diffracted image of the dose monitor pattern in the pupil surface is shifted from a center position (optical axis) of the pupil surface, and accordingly the effective numerical aperture NA in the pupil surface can use a small position.

Figure 3:
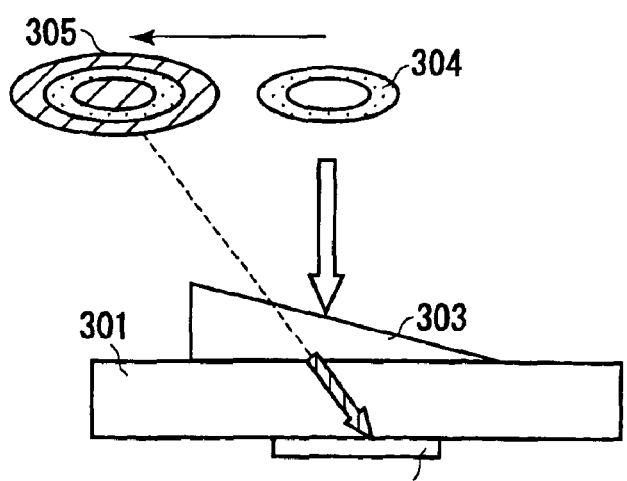
FIG. 3 is a diagram showing a schematic constitution of a mask in the dose monitor pattern formed according to the first embodiment.

A constitution will be described hereinafter in which the 0th-order diffracted image from the dose monitor pattern is shifted from the center of the pupil surface in the pupil surface. FIG. 3 is a diagram showing a schematic constitution of a mask in the dose monitor pattern is formed according to the first embodiment of the present invention.

As shown in FIG. 3, a prism 303 is disposed in an upper part of a dose monitor pattern 302 on a transparent substrate 301. The prism 303 is an optical element which has a function of tilting an illuminating flux.

The illumination light from a light source 304 is incident upon the dose monitor pattern 302 via the prism 303 and transparent substrate 301. A position of the light source viewed from the dose monitor pattern 302 looks as if the position were shifted from an actual position of the light source 304 by an optical function of the prism 303. As a result, the light source viewed from the dose monitor pattern 302 is a light source 305.

Figure 4:
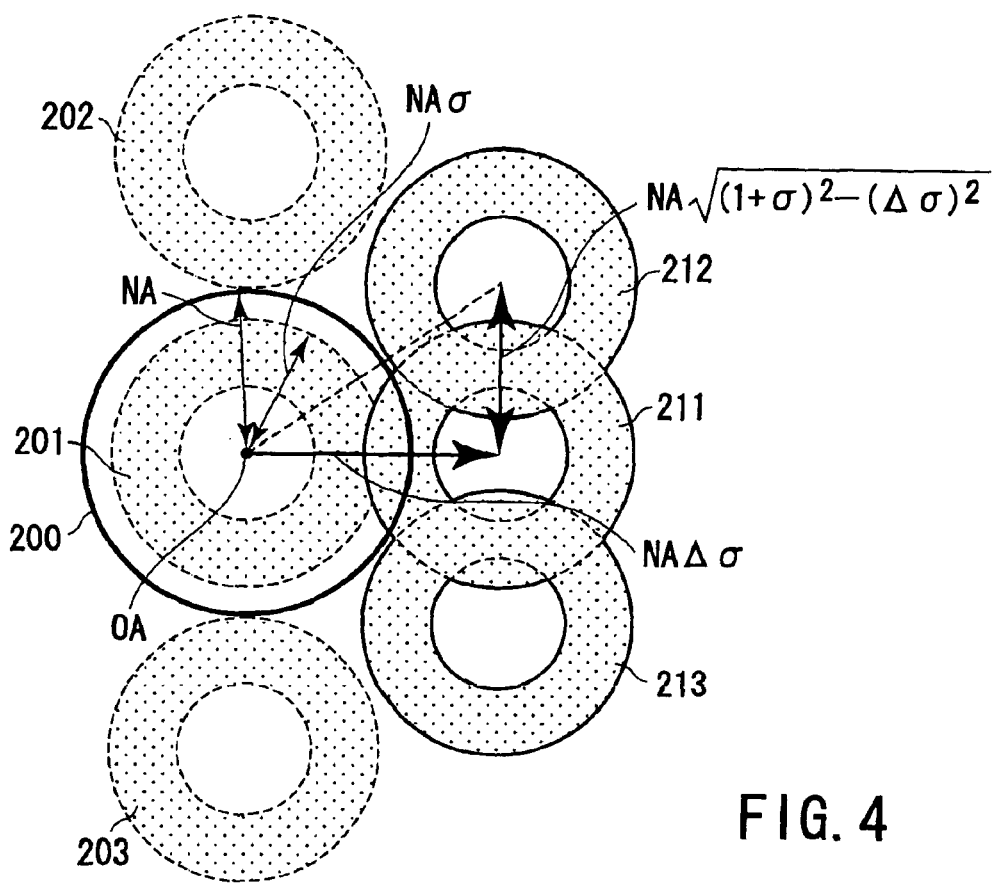
FIG. 4 is a plan view showing the diffracted light image distribution of the dose monitor pattern on the pupil surface of the projection exposure apparatus in irradiating the mask shown in FIG. 3 with illumination light.

FIG. 4 shows a plan view of the diffracted light image distribution of the dose monitor pattern on the pupil surface of the projection exposure apparatus in irradiating the mask shown in FIG. 3 with the illumination light.

As shown in FIG. 4, on the pupil surface 200, a 0th-order diffracted light image 211, a +primary diffracted light image 212, and a −primary diffracted light image 213 are formed. A center of gravity of the 0th-order diffracted light image 211 is formed in a position deviating from a center OA of the pupil surface 200. The center of gravity of the 0th-order diffracted light image 211 is formed in the position deviating from the center OA of the pupil surface, so that the illuminating flux is obliquely incident upon the dose monitor pattern 302 because of the prism 303.

Moreover, only the 0th-order diffracted light image 211 passes through the pupil surface 200. The ±primary diffracted light images 212, 213 do not pass through the pupil surface. Note that the diffracted light images 211, 212, 213 show the diffracted images obtained by illuminating the dose monitor pattern whose block width p is reduced to 0.3 μm.

Furthermore, for reference, FIG. 4 shows the 0th-order diffracted light image 201, +primary diffracted light image 202, and −primary diffracted light image 203 obtained by irradiating the dose monitor pattern with the light without passing through the prism. These diffracted light images 201, 202, 203 are obtained by illuminating the dose monitor pattern which has a block width p of 0.15 μm.

As shown in FIG. 4, when the light is obliquely incident upon the dose monitor pattern using the prism, the 0th-order diffracted light image 211 is formed in a region where the numerical aperture NA of the pupil surface 200 is effectively small. Therefore, the diffraction angle of the 0th-order diffracted light image 211 with the ±primary diffracted light images 212, 213 can be set to be small, and the condition of the width of the block in the dose monitor pattern can be eased.

As seen from FIG. 4, when the 0th-order diffracted light image 211 is shifted by Δσ in the pupil surface 200, the width p of the block required for the dose monitor pattern may be as follows:

$$\frac{1}{p} \geq \sqrt{(1+\sigma)^2 - (\Delta\sigma)^2} \frac{NA}{\lambda} \quad (3)$$

$$P \leq \frac{\lambda}{NA\sqrt{(1+\sigma)^2 - (\Delta\sigma)^2}},$$

where a shift amount Δσ is a value converted with the coherent factor.

Figure 5:
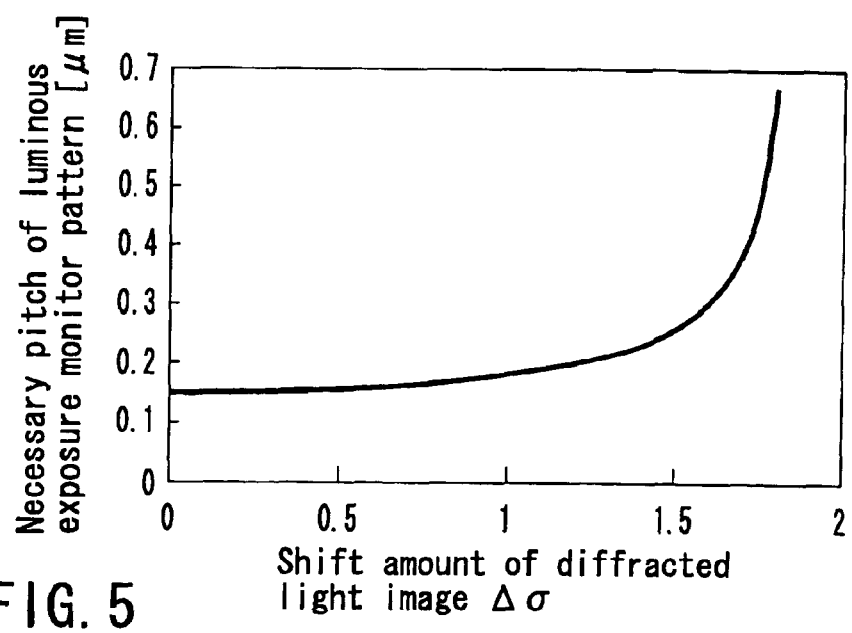
FIG. 5 is a diagram showing a relation between shift of a diffracted light image of the dose monitor pattern and a width p of a block required for the dose monitor pattern.

FIG. 5 shows a relation between the shift of the diffracted light image of the dose monitor pattern in the above-described exposure condition and the width p of the block required for the dose monitor pattern. As shown in FIG. 5, the prism is designed so as to shift the diffracted light image in the pupil surface by 1.6σ, so the block width p of the dose monitor pattern can be eased to 0.3 μm from 0.15 μm.

The present invention will more concretely be described hereinafter as compared with the related art.

Figure 6:
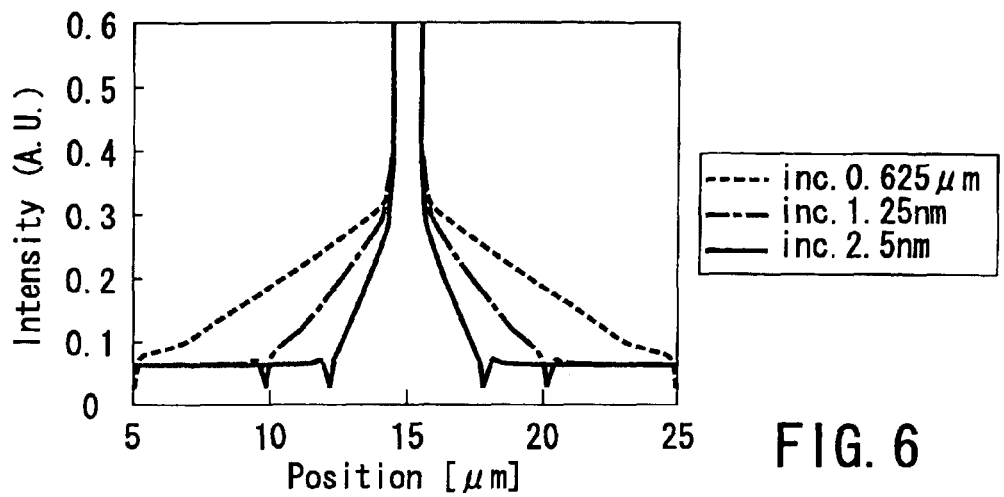
FIG. 6 is a diagram showing a diffracted light image intensity distribution on a substrate, obtained in projecting/exposing the dose monitor pattern whose block width is 0.15 $\mu$m.
Figure 7:
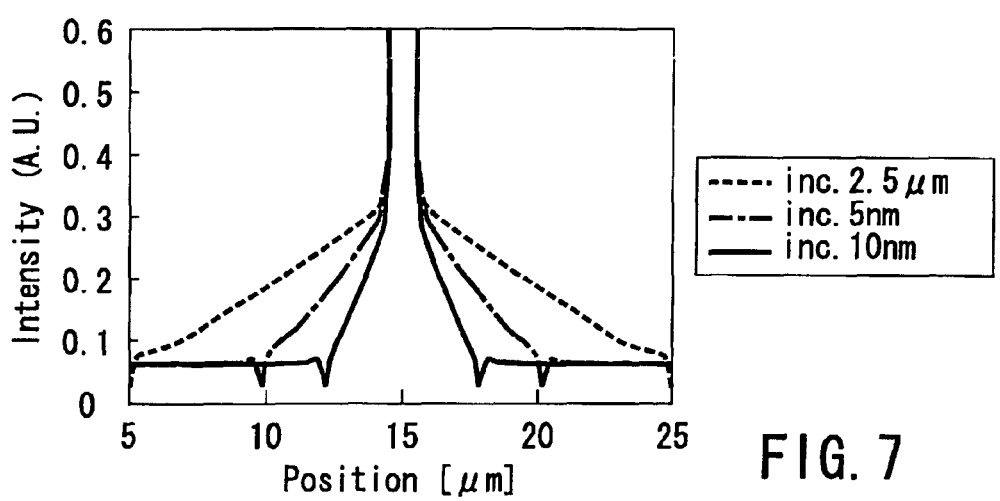
FIG. 7 is a diagram showing a diffracted light image intensity distribution on the substrate, obtained in illuminating the dose monitor pattern whose block width p is 0.3 $\mu$m via a prism.

FIG. 6 shows a diffracted light image intensity distribution on the substrate, obtained in projecting/exposing the dose monitor pattern whose block width is 0.15 μm. FIG. 7 shows the diffracted light image intensity distribution on the substrate, obtained in illuminating the dose monitor pattern whose block width p is 0.3 μm via the prism. As shown in FIG. 7, when the diffracted light image is shifted, the block width p can be set to be large. Therefore, even when the increment is eased, it is seen that a high-sensitivity detection capability can be maintained.

Figure 8:
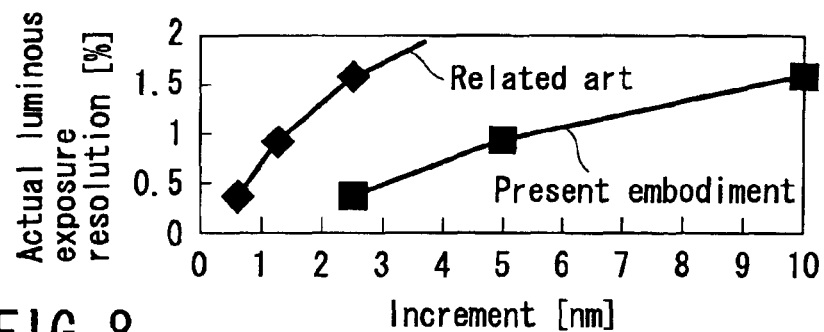
FIG. 8 is a diagram showing a relation between an increment of a duty ratio and actual dose resolution.

Moreover, FIG. 8 shows a relation between the increment of the duty ratio and an actual dose resolution. As seen from a solid line of FIG. 8, when the increment inc. is set to be fine, the resolution becomes smaller. A dot line in FIG. 8 shows dependence of the duty ratio of an actual dose resolution on the increment inc., obtained from the light intensity distribution obtained from the related-art dose monitor pattern having a block width p of 0.15 μm.

Note that the actual dose resolution also depends on the accuracy of the line width measurement apparatus which measures the dose monitor pattern. The resolution shown in FIG. 8 is a result in using the line width measurement apparatus having a guaranteed accuracy of 50 nm.

In recent years, due to the miniaturization of the device pattern, it has been necessary to effectively use a small dose margin. The detection sensitivity required for the dose monitor pattern is 0.5% or less. When the center of gravity of the diffracted light image is not shifted from the optical axis, for the increment inc., the duty ratio needs to be changed with a minute dimension of 0.625 nm (dimension on a wafer) from the required detection sensitivity. When the center of gravity of the diffracted light image in the pupil surface is shifted from the optical axis, the block width p can be set to be as much as 0.3 μm. Therefore, to obtain a detection sensitivity of 0.5% or less, the increment may be designed to be 2.5 nm. This increment value is four times the related-art value.

As a result, a high resolution can be realized in the image intensity distribution shown in FIG. 7 and in a loose increment shown by the solid line of FIG. 9.

A concrete constitution of the dose monitor pattern for obtaining the same dose detection sensitivity is shown in FIGS. 9A, 9B. FIG. 9A is a plan view showing the constitution of the related-art dose monitor pattern. FIG. 9B is a plan view showing the constitution of the dose monitor pattern according to the first embodiment of the present invention.

The dose monitor pattern is a pattern not resolved. Therefore, when a light/dark ratio of the pattern is the same, the same intensity distribution can be obtained. As a result, the block width p can be doubled as shown in FIG. 9B, and the increment can be eased fourfold.

As described above, the restriction of the width of the block of the dose monitor pattern can be greatly relaxed. Even when the duty ratio is not set to be extremely fine, the necessary detection sensitivity of the effective dose can be secured. When two design items are relaxed, the dose monitor pattern can be prepared with good accuracy. Therefore, it is possible to enhance yield of mask preparation and to greatly reduce the burden in an inspection step.

Note that this time the prism is used as means for shifting the center of the pupil surface from the center of gravity of the diffracted light image. However, this means is not especially limited. For example, as shown in FIG. 10, a phase shift grating 313 is disposed in the transparent substrate 301 for the dose monitor pattern 302. Moreover, the actual light source is a light source 314, but the light source viewed from the dose monitor pattern 302 is a substantial light source 315. Alternatively, as shown in FIG. 11, on the transparent substrate 301, a transparent substrate 323a is disposed which has an optical element of a phase shift grating 323b. Moreover, the actual light source is a light source 324, but the light source viewed from the dose monitor pattern 302 is a substantial light source 325. Moreover, the prism or phase shift grating may also be disposed under the transparent substrate. Moreover, when a test mask is used for adjustment or QC for each process unit, as shown in FIG. 12, a light source 335 is shifted directly from the optical axis in performing the illumination. In this case also the same effect is obtained.

Note that in the present embodiment, orbicular zone illumination is used as the illuminating. However, even with conventional illuminating in which the center of the illumination light emitted from a substantially circular plane light source substantially agrees with the optical axis, the same effect is obtained. Even when the technique of the present embodiment is applied to multipolar illuminating including a plurality of eccentric light sources, the effect is obtained. With the multipolar illuminating, the center of gravity of a plurality of formed 0th-order diffracted light images may be shifted from the optical axis.

(Second Embodiment)

Furthermore, the present inventors have considered that the illumination is performed from an asymmetric position with respect to the optical axis to form the image, in this case, the position of the formed image of the pattern shifts in a focus state, and this is used to monitor not only the effective dose but also the focus. FIG. 13 concretely shows a method of monitoring the focus.

A prism 402 is formed on the surface of a transparent substrate 401. On the back surface of the transparent substrate 401, a dose monitor pattern 403, first focus monitor pattern 404, second focus monitor pattern 405, first position shift inspection pattern 406, and second position shift inspection pattern 407 are formed. The dose monitor pattern 403 and first focus monitor pattern 404 are formed under the prism 402.

This reticle is used to expose a first shot region S1 on a substrate 410. The prism 402 allows the illuminating flux to be eccentric and obliquely incident upon a dose monitor pattern 403 and first focus monitor pattern 404. The illumination light is not eccentric with respect to the second focus monitor pattern 405, and first and second position shift inspection patterns 406, 407. Note that the resist film is formed in the surface of the substrate 410.

Since the illuminating flux is eccentric and obliquely incident upon the first focus monitor pattern 404, a position of a latent image 414 of the first focus monitor pattern formed on the substrate 410 changes in accordance with the focal position.

After the exposure with respect to the first shot region S1, a second shot region S2 is exposed. The second shot region S2 is set to partially overlap the first shot region S1. The latent image 414 of the first focus monitor pattern formed in the first shot region S1 is formed so as to overlap a latent image 415 of the second focus monitor pattern formed in the second shot region S2. A latent image 416 of the first position shift inspection pattern formed in the first shot region S1 is formed to overlap a latent image 417 of the second position shift inspection pattern formed in the second shot region S2.

The position where the latent image 414 of the first focus monitor pattern is formed changes in accordance with the focal position. Moreover, the formed position of the latent image 415 of the second focus monitor pattern does not change in accordance with the focal position. Therefore, when the shift amount between the patterns formed by the latent images 414, 415 is measured by an alignment shift inspection apparatus after development, the focal position can be detected. At this time, when the shift amount between the resist patterns formed from the latent images 416, 417 of the first and second position shift inspection patterns 406, 407 is measured, alignment shift of a stage is corrected.

Note that the focus monitor pattern is not limited to the above-described example. When the center of gravity of the diffracted image on the pupil surface shifts from the optical axis, the shift of the pattern with respect to defocus is used, and the present invention can similarly variously modified be and applied.

(Third Embodiment)

In a third embodiment, an effective technique in double pole illumination shown in FIG. 14 will be described in detail. For the double pole illumination, as shown in FIG. 14, two eccentric light sources 501 are disposed symmetrically about a point with respect to the optical axis OA. For concrete illuminating conditions in the present embodiment, a distance $\sigma_1$ to the center of the eccentric light source 501 from the optical axis OA is $0.65\sigma$, and a size $\sigma_r$ of the eccentric light source 501 is $0.2\sigma$. In the same manner as in the first embodiment, the exposure apparatus is the ArF excimer laser exposure apparatus (wavelength $\lambda$: 0.193 $\mu$m) in which the numerical aperture NA is 0.68, and the coherent factor $\sigma$ is 0.85.

The present inventors have found that the arrangement direction of the dose monitor pattern is devised in accordance with the shape of the double pole illumination designed for preferable exposure of a main pattern, and accordingly a period of the monitor pattern can loosely be set.

FIG. 15 is a diagram showing an arrangement relation between the double pole illumination and dose monitor pattern according to the third embodiment of the present invention.

Concretely, as shown in FIG. 15, it has been found that it is most effective to change the increment of a fine pitch of a dose monitor pattern 503 and dispose the pattern in a direction (B–B') crossing at right angles to a line A–A' connecting the centers of the eccentric light sources 501 of the double pole illumination to each other. In FIG. 15 reference numeral 502 denotes the reticle.

Figure 16:
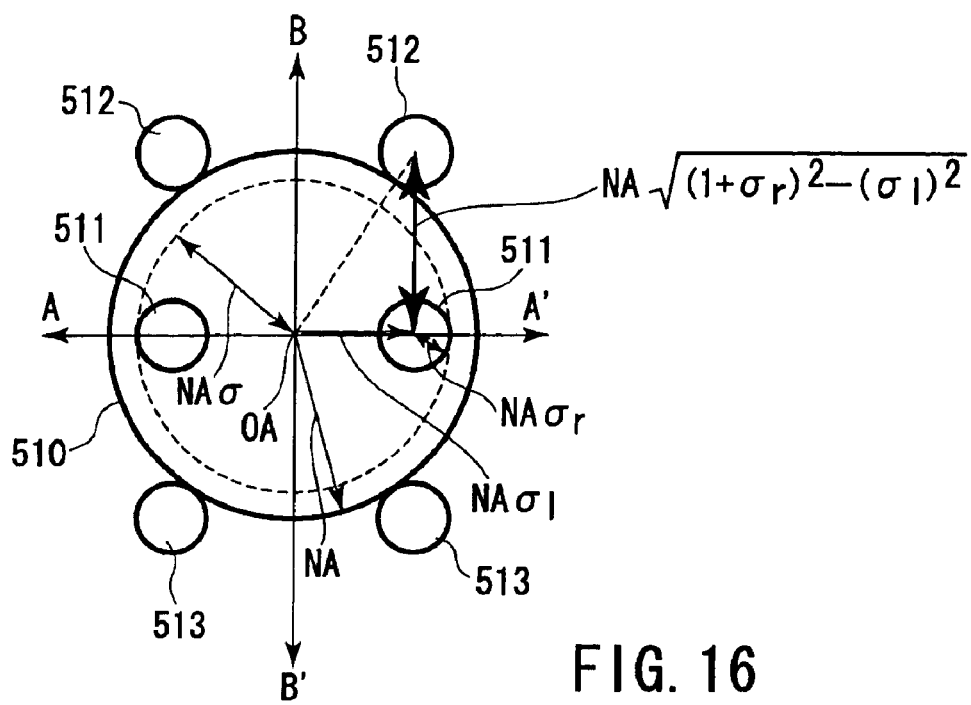
FIG. 16 is a diagram showing the diffracted light image distribution on the pupil surface of a projection optical system, obtained in illuminating the dose monitor pattern in a state of the arrangement relation shown in FIG. 15.

FIG. 16 shows the diffracted image distribution on the pupil surface of a projection optical system, obtained in illuminating the dose monitor pattern with the use of the arrangement relation. As shown in FIG. 16, the condition that only a 0th-order diffracted image 511 passes through a pupil surface 510 in the diffracted images of the dose monitor pattern 503 is satisfied. Moreover, the diffraction angle from the dose monitor pattern is narrowest. This state is a most eased condition of the block width p of the dose monitor pattern. In FIG. 16 reference numeral 512 denotes a +primary diffracted light image and 513 denotes a −primary diffracted light image.

As shown in FIG. 16, when the double pole illumination and dose monitor pattern are disposed, the block width p of the dose monitor pattern may be set to satisfy the following.

$$p \le \frac{\lambda}{NA\sqrt{(1+\sigma_r)^2 - \sigma_1^2}} \quad (4)$$

Figure 17:
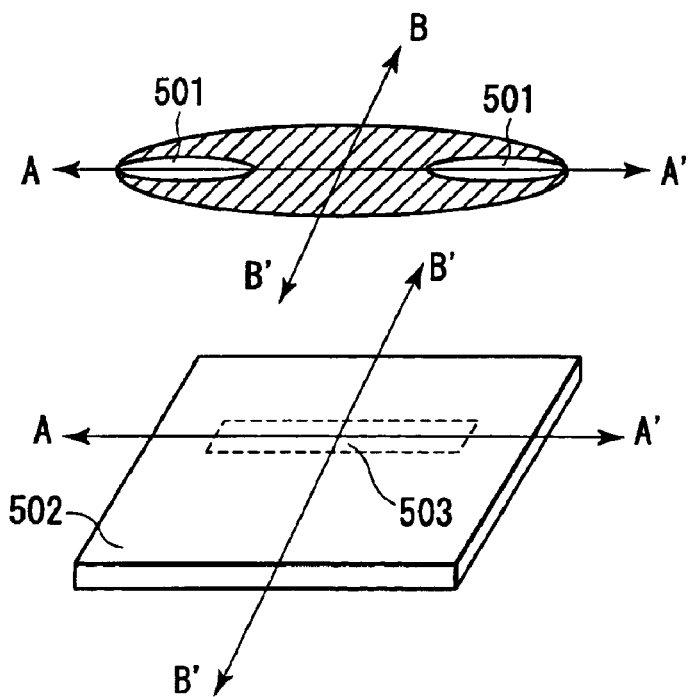
FIG. 17 is a diagram showing the arrangement relation between a related-art double pole illumination and dose monitor pattern.

Concretely, in the above-described exposure condition, the block width p of the dose monitor pattern may be set to 0.28 $\mu$m. An example in which the arrangement relation shown in FIG. 15 is not considered is shown in FIG. 17. In FIG. 17 the same components as those of FIG. 15 are denoted with the same reference numerals, and the detailed description is omitted. As shown in FIG. 17, the increment of the fine pitch of the dose monitor pattern 503 is changed to arrange the pattern with respect to the line A–A' connecting the centers of two eccentric light sources 501 to each other.

Figure 18:
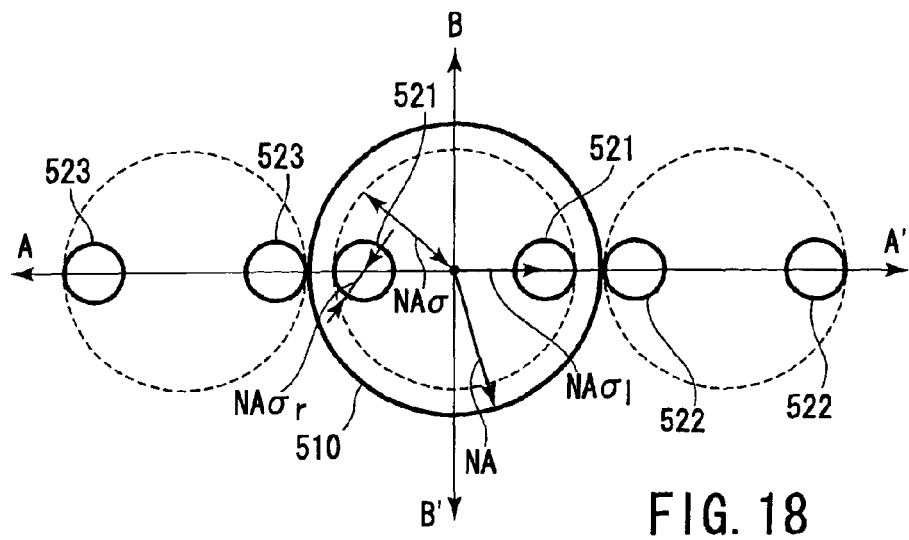
FIG. 18 is a diagram showing the diffracted light image distribution on the pupil surface of the projection optical system, obtained in illuminating the dose monitor pattern in the state of the arrangement relation shown in FIG. 17.

Moreover, FIG. 18 shows the position of the diffracted light image in the pupil surface in performing the exposure in the arrangement relation shown in FIG. 17. In FIG. 18 the same components as those of FIG. 16 are denoted with the same reference numerals, and the detailed description is omitted. In FIG. 18, reference numeral 521 denotes a 0th-order diffracted light image, 522 denotes a +primary diffracted light image, and 523 denotes a −primary diffracted light image.

When the double pole illumination and dose monitor pattern are disposed as shown in FIG. 17, from the above equations (1), (2), the block width p of the dose monitor pattern is 0.15 µm.

On the other hand, with the arrangement relation shown in FIG. 15, the block width p of the dose monitor pattern is 0.28 µm. Therefore, by the arrangement relation shown in FIG. 15, the period can largely be eased. As a result, as described in the first embodiment, the increment of the duty ratio of the dose monitor pattern can also be relaxed to 2 nm from 0.625 nm.

As described above, the restriction of the period of the dose monitor pattern can largely be relaxed. Even when the duty ratio is not set to be extremely fine, the detection sensitivity of the effective dose with high sensitivity can be secured. As a result, the dose monitor pattern can constantly be prepared with good accuracy, thus it is possible to enhance the yield of mask preparation and to largely reduce the burden on the inspection step. As a result, a high accuracy exposure control can be realized.

In the present embodiment, the eccentric light source shape in the double pole illumination is circular. However, the present invention is not limited to this, and can similarly be applied to variously shaped eccentric light sources. Additionally, with an eccentric light source shape which is not circular, correction is necessary with the shape change with respect to equation (4).

(Fourth Embodiment)

Figure 19:
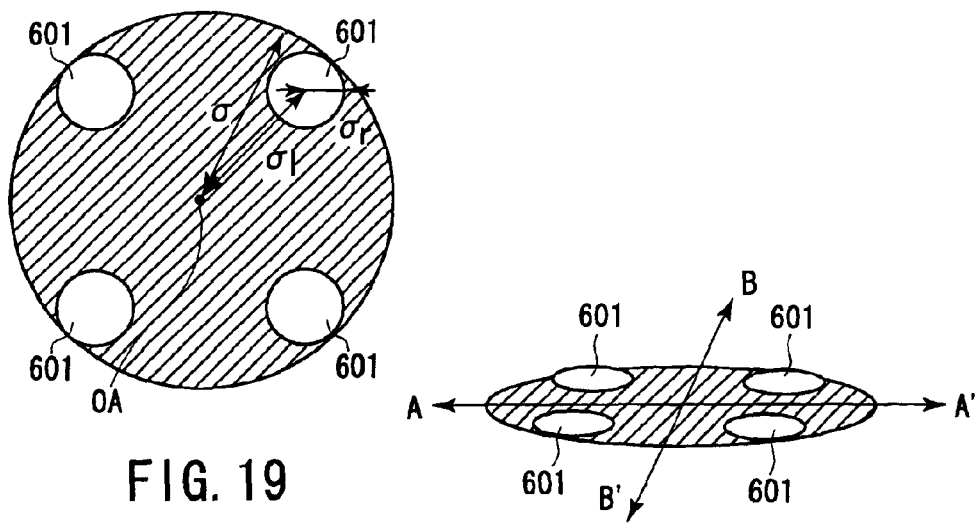
FIG. 19 is a diagram showing the schematic constitution of fourfold pole illumination according to a fourth embodiment.

In the third embodiment, the illuminating method of the actual device is effective for double pole illumination. On the other hand, in a fourth embodiment, a technique effective for fourfold pole illumination will be described in detail with respect to FIG. 19. For the fourfold pole illumination, as shown in FIG. 19, four eccentric light sources 601 are positioned symmetrically four times with respect to the optical axis OA.

For the illumination conditions of the fourfold pole illumination, the distance $\sigma_1$ to the center of the eccentric light source 601 from the optical axis OA is 0.65σ, the size $\sigma_r$ of the circular eccentric light source 601 is 0.2σ, and the circular eccentric light sources 601 are distributed at an equal interval of 90_degrees in four symmetries. In the same manner as in the first embodiment, the exposure apparatus is the ArF excimer laser exposure apparatus (wavelength λ: 0.193 µm) in which the numerical aperture NA is 0.68, and the coherent factor σ is 0.85.

The present inventors have found that the arrangement direction of the dose monitor pattern is devised in accordance with the shape of the fourfold pole illumination designed for the preferable exposure of the main pattern, and accordingly the block width p of the monitor pattern can loosely be set.

Figure 20:
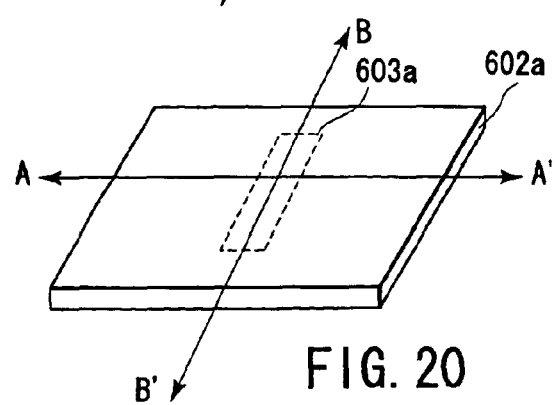
FIG. 20 is a diagram showing the arrangement relation between the fourfold pole illumination and dose monitor pattern according to the fourth embodiment.
Figure 21:
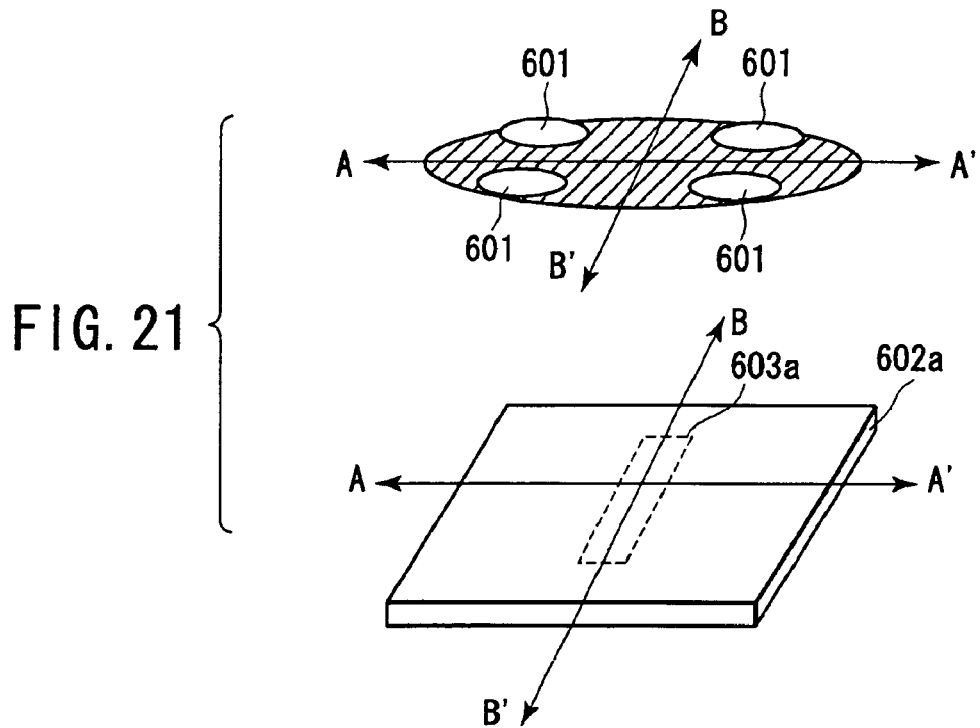
FIG. 21 is a diagram showing the arrangement relation between the fourfold pole illumination and dose monitor pattern according to the fourth embodiment.

FIGS. 20 and 21 are diagrams showing the arrangement relation between the fourfold pole illumination and dose monitor pattern according to the fourth embodiment of the present invention.

Two symmetry axes A–A', B–B' are considered which pass through the optical axis OA in a secondary light source plane and do not pass through the center of the eccentric light source 601 and about which four eccentric light sources 601 are linearly symmetrical. At this time the increment of the fine pitch is changed, and dose monitor patterns 603a, b are arranged in alignment with one of the directions of the lines A–A' and B–B'.

Figure 22:
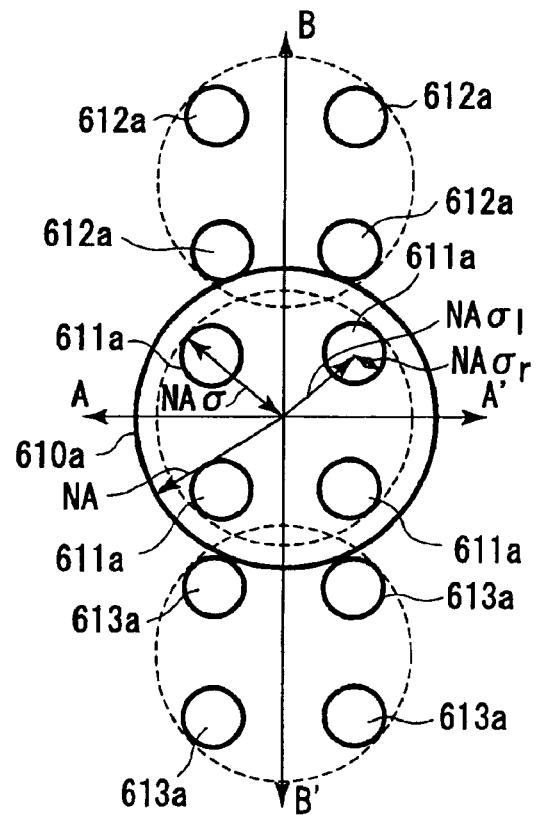
FIG. 22 is a plan view showing the diffracted light image distribution on the pupil surface, obtained by performing exposure in the arrangement relation between the fourfold pole illumination and dose monitor pattern shown in FIG. 20.
Figure 23:
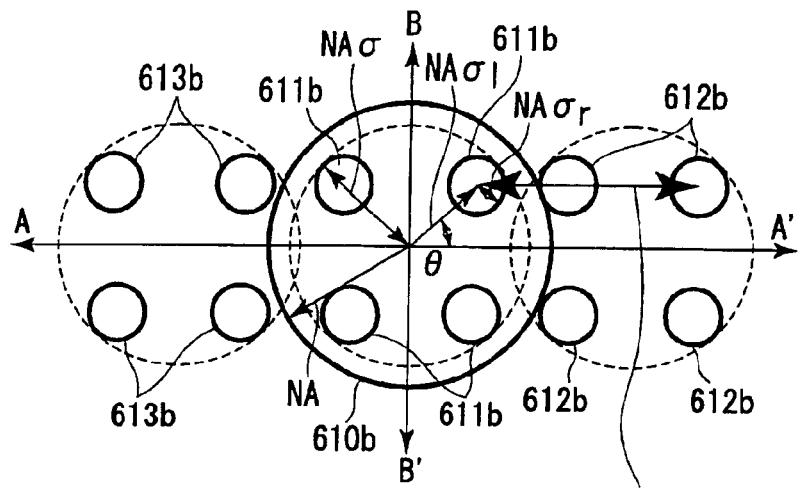
FIG. 23 is a plan view showing the diffracted light image distribution on the pupil surface, obtained by performing the exposure in the arrangement relation between the fourfold pole illumination and dose monitor pattern shown in FIG. 21.

The distribution of the diffracted light image on the pupil surface with the use of the arrangement relation shown in FIGS. 20, 21 is shown in FIGS. 22, 23. FIG. 22 is a plan view showing the distribution of the diffracted light image on the pupil surface, obtained by performing the exposure in the arrangement relation between the fourfold pole illumination and dose monitor pattern shown in FIG. 20. FIG. 23 is a plan view showing the distribution of the diffracted light image on the pupil surface, obtained by performing the exposure in the arrangement relation between the fourfold pole illumination and dose monitor pattern shown in FIG. 21.

The condition that only the 0th-order diffracted images 611a, b pass through pupil surfaces 610a, b in the diffracted images of the dose monitor pattern is satisfied. Moreover, the diffraction angle from the dose monitor pattern is narrowest. This state is the most eased condition of the period of the dose monitor pattern. Note that in FIGS. 22, 23 reference numerals 612a, b denote +primary diffracted light images and 613a, b denote −primary diffracted light images.

With the use of the arrangement relation of FIGS. 20, 21, the block width p of the dose monitor pattern may be set to satisfy the following.

$$P \leq \frac{\lambda}{NA}\left\{\frac{-\sigma_1\cos\theta + \sqrt{\sigma_1^2\cos^2\theta + (1+\sigma_r)^2 - \sigma_1^2}}{(1+\sigma_r)^2 - \sigma_1^2}\right\} \quad (5)$$

Concretely, it has been found that on the above-described exposure conditions, the block width p of the dose monitor pattern may be set to 0.18 µm at θ=45°.

Figure 24:
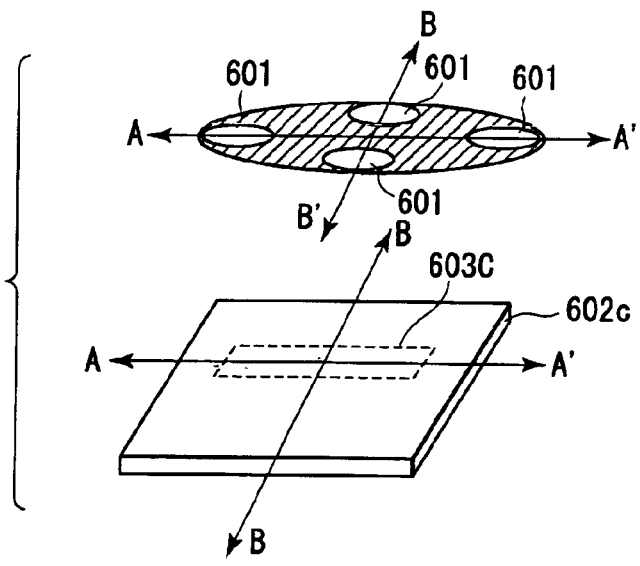
FIG. 24 is a diagram showing the arrangement relation between the fourfold pole illumination and dose monitor pattern in a related art.
Figure 25:
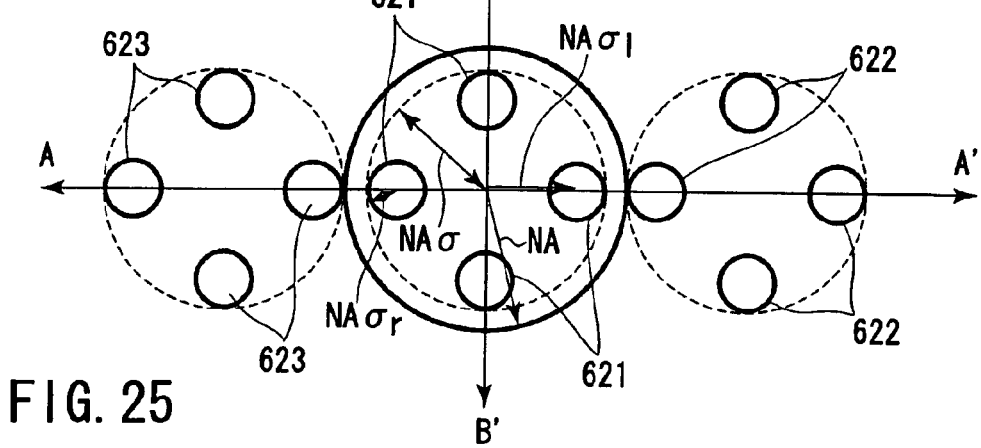
FIG. 25 is a plan view showing the diffracted light image distribution on the pupil surface, obtained by performing the exposure in the arrangement relation between the fourfold pole illumination and dose monitor pattern shown in FIG. 24.

In comparison with FIGS. 20, 21, a case is shown in FIG. 24 in which related-art light source shape and arrangement relation are not considered. In FIG. 24 reference numerals 601 denote eccentric light sources, 602c denotes a reticle, and 603c denotes a dose monitor pattern. FIG. 25 shows a plan view showing the distribution of the diffracted light image on the pupil surface, obtained by performing the exposure in the arrangement relation between the fourfold pole illumination and dose monitor pattern shown in FIG. 24.

With the arrangement shown in FIG. 24, from the above equations (1), (2), the block width p of the dose monitor pattern is 0.15 µm. On the other hand, with the arrangement shown in FIGS. 20, 21, the block width p of the dose monitor pattern is 0.18 µm. Therefore, the block width can be eased. As a result, as described in the first embodiment, the increment of the duty ratio of the dose monitor pattern can also be relaxed to 0.9 nm from 0.625 nm. As a result, the dose control with high accuracy can be realized.

As described above, the restriction of the period of the dose monitor pattern can largely be relaxed. Even when the duty ratio is not set to be extremely fine, the detection sensitivity of the effective dose with igh sensitivity can be secured. Therefore, the dose monitor pattern can constantly be prepared with good accuracy, and it is possible to enhance the yield of mask preparation and to largely reduce the burden on the inspection step.

Note that in the present embodiment, the eccentric light source shape in the fourfold pole illumination is circular. However, the present invention is not limited to this, and can similarly be applied to various shapes. Additionally, the correction is sometimes necessary with the shape change with respect to equation (5).

(Fifth Embodiment)

In a fifth embodiment, a technique effective for the fourfold pole illumination of two symmetries shown in FIG. 26, not four symmetries, will be described.

Figure 26:
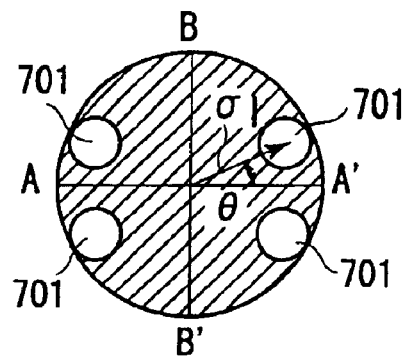
FIG. 26 is a plan view showing the schematic constitution of the fourfold pole illumination according to a fifth embodiment.

As shown in FIG. 26, four circular eccentric light sources 701 are disposed in two symmetries with respect to the optical axis. For the two symmetries, two symmetry axes of the lines A–A' and B–B' exist. At this time, it is most effective to change the increment of the fine pitch and to dispose a dose monitor pattern 703 substantially in parallel with the symmetry axis more distant from the center of the eccentric light source 701.

In the fourfold pole illumination shown in FIG. 26, a distance between the axis B–B' and the center of the light source 701 is longer than that between the axis A–A' and the center of the light source 701. Therefore, as shown in FIG. 27, the increment of the fine pitch of the dose monitor pattern 703 formed in a reticle 702 is changed to dispose the pattern along the axis B–B'.

Figure 27:
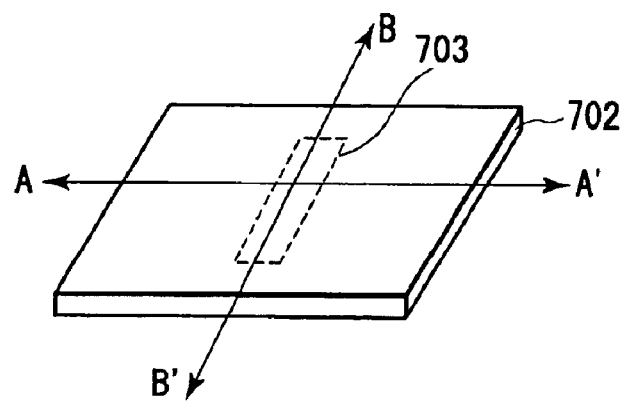
FIG. 27 is a diagram showing the arrangement relation of the dose monitor pattern with respect to a light source shape of the fourfold pole illumination shown in FIG. 26 according to a fifth embodiment.
Figure 28:
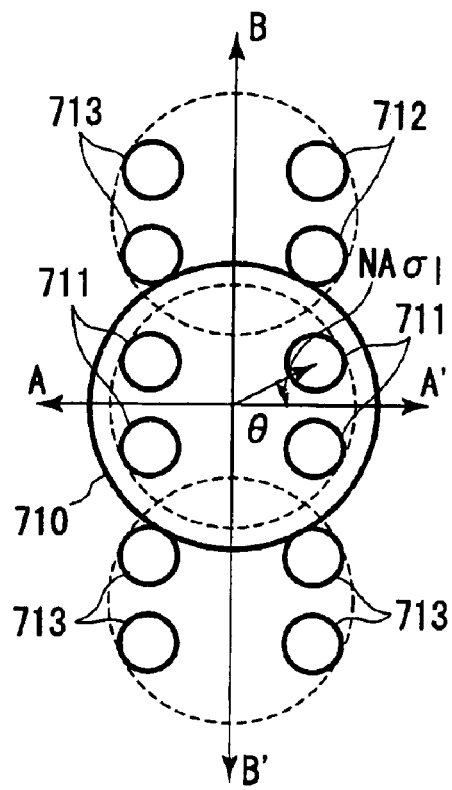
FIG. 28 is a plan view showing the distribution of the diffracted light image on the pupil surface, obtained by performing the exposure in the arrangement relation shown in FIGS. 26 and 27.

FIG. 28 shows a plan view showing the distribution of the diffracted light image on the pupil surface, obtained by performing the exposure in the arrangement relation shown in FIGS. 26, 27. As shown in FIG. 28, the condition that only the 0th-order diffracted images 711a, b pass through a pupil surface 710 in the diffracted images of the dose monitor pattern is satisfied. Moreover, the diffraction angle from the dose monitor pattern is narrowest. This state is the most eased condition of the block width p of the dose monitor pattern. In FIG. 28 reference numerals 712 denote +primary diffracted light images and 713 denote −primary diffracted light images.

The above-described conditions can be described in other words as follows. A case is considered in which an anticipated angle between one symmetry axis and the light source center is assumed to be θ. In FIG. 26, the anticipated angle θ between the axis A–A' and the light source 701 center is measured.

Figures 29A, 29B:
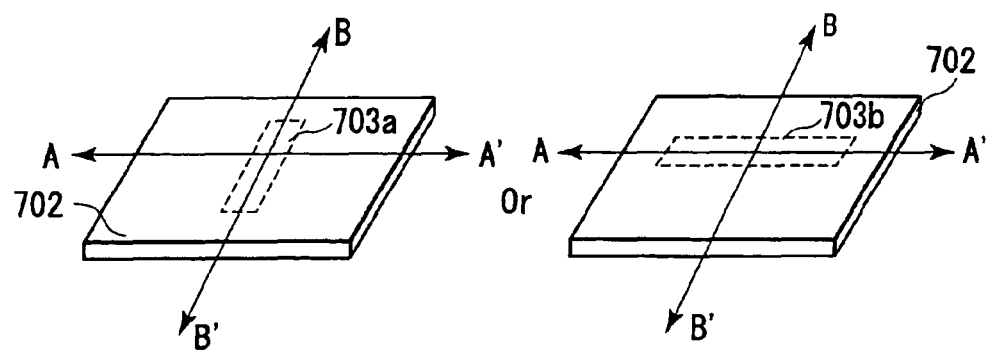
FIGS. 29A and 29B are diagrams showing the arrangement relation of the dose monitor pattern with respect to the light source shape of the fourfold pole illumination.

With 0°<θ<45°, as shown in FIG. 29A, the block of a dose monitor pattern 703a is disposed along the axis B–B' crossing at right angles to an axis for use in a reference of the anticipated angle. With 45°<θ<90°, as shown in FIG. 29B, the block of a dose monitor pattern 703b is disposed along the axis A–A' for use in the measurement of the anticipated angle.

Figure 30:
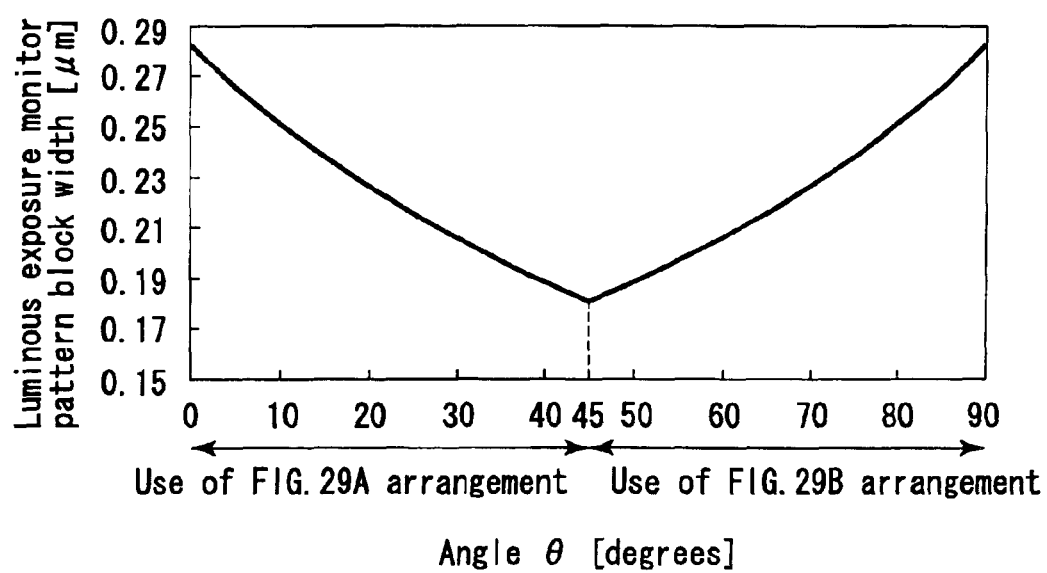
FIG. 30 is a diagram showing a relation between an anticipated angle θ and a block width p of the dose monitor pattern.

Moreover, FIG. 30 shows a relation between the anticipated angle θ and the block width p of the dose monitor pattern, obtained from the equation (5). With 0°<θ<45°, the pattern layout shown in FIG. 29A is used. Conversely, with 45°<θ<90°, the pattern layout shown in FIG. 29B is used. In this case, the period of the dose monitor pattern can largely be eased.

As described above, the restriction of the period of the dose monitor pattern can largely be relaxed. Even when the duty ratio is not set to be extremely fine, the detection sensitivity of the effective dose with high sensitivity can be secured. Therefore, the dose monitor pattern can constantly be prepared with good accuracy, and it is possible to enhance the yield of mask preparation and to largely reduce the burden onto the inspection step.

Note that in the present embodiment, the eccentric light source shape in the fourfold pole illumination is circular. However, the present invention is not limited to this case, and can similarly be applied to various shapes. Additionally, the correction is sometimes necessary with the shape change with respect to equation (5).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dose monitor method comprising:
    illuminating a mask with illumination light, which is disposed in a projection exposure apparatus and in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;
    passing only a 0th-order diffracted light through a pupil surface of the projection exposure apparatus in diffracted lights of the dose monitor pattern; and
    transferring a 0th-order diffracted light image of the dose monitor pattern onto a substrate to measure dose,
    wherein during the illuminating, a center of gravity of the 0th-order diffracted light image passed through the dose monitor pattern on the pupil surface of the projection exposure apparatus is shifted from an optical axis of the projection exposure apparatus.

2. The dose monitor method according to claim 1, wherein the illumination of the projection exposure apparatus is usual illuminating in which a center of illumination light emitted from a circular plane light source agrees with an optical axis, or orbicular zone illumination.

3. The dose monitor method according to claim 1, wherein assuming an exposure wavelength of the projection exposure apparatus is λ, a substrate-side numerical aperture is NA, a coherent factor is σ, and a shift amount of a center of gravity of the 0th-order diffracted light image in the pupil surface of the projection exposure apparatus converted with the coherent factor σ is Δσ, the width p in a converted dimension on the substrate satisfies the following condition:

$$P \leq \frac{\lambda}{NA\sqrt{(1+\sigma)^2 - (\Delta\sigma)^2}}.$$

4. The dose monitor method according to claim 1, further comprising: illuminating the mask with the illumination light in a state in which an optical element including a prism or phase shift grating is disposed above or below the dose monitor pattern.

5. The dose monitor method according to claim 1, wherein the 0-th diffracted light image in the pupil surface is shifted in a diffracted image crossing at right angles to the one direction.

6. The dose monitor method according to claim 1, further comprising:
    transferring the 0th-order diffracted light image of the dose monitor pattern onto a resist film disposed in the substrate; and
    measuring the dose from a length of the direction of a latent image transferred onto the resist film or a pattern obtained by developing the resist film.

7. A dose monitor method comprising:
    disposing a mask in which a dose monitor pattern is formed including a plurality of blocks intermittently or continuously arranged in one direction each including a shield portion and transmission portion arranged in a constant width p incapable of being resolved in a projection exposure apparatus in the direction and having a monotonously changing dimension ratio of the shield portion to the transmission portion of the block in the direction in the projection exposure apparatus comprising double pole illumination in which two eccentric light sources are disposed symmetrically about a point with respect to an optical axis;

illuminating the mask with illumination light;

passing only a 0th-order diffracted light through a pupil surface of the projection exposure apparatus in diffracted lights of the dose monitor pattern; and transferring a 0th-order diffracted light image of the dose monitor pattern onto a substrate to measure dose, wherein the direction crosses at right angles to an arrangement direction of the two eccentric light sources.

8. The dose monitor method according to claim 7, wherein assuming that an exposure wavelength of the projection exposure apparatus is $\lambda$, a photosensitive substrate side numerical aperture is NA, a coherent factor is $\sigma$, and a distance to an eccentric light source center from the optical axis converted with the coherent factor $\sigma$ and a radius of the eccentric light source is $\sigma_1$ and $\sigma_r$, respectively, the width p in the converted dimension on the substrate satisfies the following condition:

$$p \leq \frac{\lambda}{NA\sqrt{(1+\sigma_r)^2 - (\sigma_1)^2}}.$$

9. The dose monitor method according to claim 7, further comprising:

transferring the 0th-order diffracted light image of the dose monitor pattern onto a resist film disposed in the substrate; and measuring the dose from a length of the direction of a latent image transferred onto the resist film or a pattern obtained by developing the resist film.

10. A dose monitor method comprising:

preparing a projection exposure apparatus comprising fourfold pole illumination in which four eccentric light sources are disposed symmetrically four times with respect to an optical axis;

preparing a mask in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;

disposing the mask in the projection exposure apparatus;

illuminating the mask with illumination light;

passing only a 0th-order diffracted light through a pupil surface of the projection exposure apparatus in diffracted lights of the dose monitor pattern; and transferring a 0th-order diffracted light image of the dose monitor pattern onto a substrate to measure dose, wherein the direction passes through the optical axis and extends in parallel with one of two symmetry axes which do not pass through a center of the eccentric light source.

11. The dose monitor method according to claim 10, wherein assuming that an exposure wavelength of the projection exposure apparatus is $\lambda$, a photosensitive substrate side numerical aperture is NA, a coherent factor is $\sigma$, a distance to an eccentric light source center from the optical axis and a radius of the eccentric light source converted with the coherent factor $\sigma$ are $\sigma_1$ and $\sigma_r$, respectively, and an anticipated angle between one of the symmetry axes and the eccentric light source center is $\theta$, the width p in the converted dimension on the substrate satisfies the following condition:

$$P \leq \frac{\lambda}{NA}\left\{\frac{-\sigma_1\cos\theta + \sqrt{\sigma_1^2\cos^2\theta + (1+\sigma_r)^2 - \sigma_1^2}}{(1+\sigma_r)^2 - \sigma_1^2}\right\}.$$

12. A dose monitor method comprising:

preparing a projection exposure apparatus comprising fourfold pole illumination in which four eccentric light sources are disposed symmetrically twice with respect to an optical axis;

preparing a mask in which a dose monitor pattern is formed including a plurality of blocks intermittently or continuously arranged in one direction each including a shield portion and transmission portion arranged in a constant width p incapable of being resolved in the projection exposure apparatus in the direction and having a monotonously changing dimension ratio of the shield portion to the transmission portion of the block in the direction;

disposing the mask in the projection exposure apparatus;

illuminating the mask with illumination light;

passing only a 0th-order diffracted light through a pupil surface of the projection exposure apparatus in diffracted lights of the dose monitor pattern; and transferring the dose monitor pattern onto a substrate to measure dose, wherein the direction extends in parallel with a symmetry axis distant from an eccentric light source center in two symmetry axes.

13. The dose monitor method according to claim 12, wherein assuming that an exposure wavelength of the projection exposure apparatus is $\lambda$, a photosensitive substrate side numerical aperture is NA, a coherent factor is $\sigma$, a distance to an eccentric light source center from the optical axis and a radius of the eccentric light source converted with the coherent factor $\sigma$ are $\sigma_1$ and $\sigma_r$, respectively, and an anticipated angle between the symmetry axis distant from the eccentric light source center and the eccentric light source center is $\theta$, the width p in the converted dimension on the substrate satisfies the following condition:

$$P \leq \frac{\lambda}{NA}\left\{\frac{-\sigma_1\cos\theta + \sqrt{\sigma_1^2\cos^2\theta + (1+\sigma_r)^2 - \sigma_1^2}}{(1+\sigma_r)^2 - \sigma_1^2}\right\}.$$

14. The dose monitor method according to claim 12, further comprising:

transferring the 0th-order diffracted light image of the dose monitor pattern onto a resist film disposed in the substrate; and measuring the dose from a length of the direction of a latent image transferred onto the resist film or a pattern obtained by developing the resist film.

15. A manufacturing method of a semiconductor device, comprising:

measuring dose on a substrate by the dose monitor method according to claim 1 to calibrate the dose based on a measured value; and transferring a semiconductor device pattern onto a resist film formed on the semiconductor substrate after the calibration of the dose.

16. A manufacturing method of a semiconductor device, comprising:

measuring dose on a substrate by the dose monitor method according to claim 7 to calibrate the dose based on a measured value; and transferring a semiconductor device pattern onto a resist film formed on the semiconductor substrate after the calibration of the dose.

17. A manufacturing method of a semiconductor device, comprising:

measuring dose on a substrate by the dose monitor method according to claim 10 to calibrate the dose based on a measured value; and transferring a semiconductor device pattern onto a resist film formed on the semiconductor substrate after the calibration of the dose.

18. A manufacturing method of a semiconductor device, comprising:

measuring dose on a substrate by the dose monitor method according to claim 12 to calibrate the dose based on a measured value; and transferring a semiconductor device pattern onto a resist film formed on the semiconductor substrate after the calibration of the dose.

* * * * *